(12) United States Patent
Li et al.

(10) Patent No.: US 10,796,780 B2
(45) Date of Patent: Oct. 6, 2020

(54) SHIFT REGISTER UNIT AND DRIVING METHOD THEREOF, GATE DRIVING CIRCUIT AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yan Li, Beijing (CN); Bo Gao, Beijing (CN); Lingyun Shi, Beijing (CN); Wei Sun, Beijing (CN); Yang Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 195 days.

(21) Appl. No.: 15/992,948

(22) Filed: May 30, 2018

(65) Prior Publication Data
US 2019/0051365 A1 Feb. 14, 2019

(30) Foreign Application Priority Data
Aug. 8, 2017 (CN) .......................... 2017 1 0670316

(51) Int. Cl.
*G11C 19/00* (2006.01)
*G11C 19/28* (2006.01)
(Continued)

(52) U.S. Cl.
CPC ............. *G11C 19/287* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS

2008/0219401 A1* 9/2008 Tobita .................. G09G 3/3677
377/79
2014/0062847 A1* 3/2014 Chien .................. G09G 3/3677
345/100
(Continued)

FOREIGN PATENT DOCUMENTS

CN 102419949 A 4/2012
CN 103137061 A 6/2013
(Continued)

OTHER PUBLICATIONS

Chinese Office Action in Chinese Application No. 201710670316.5, dated Mar. 4, 2019 with English translation.

*Primary Examiner* — Tuan T Lam
(74) *Attorney, Agent, or Firm* — Collard & Roe, P.C.

(57) ABSTRACT

A shift register unit and a driving method thereof, a gate driving circuit and a display apparatus. The shift register unit includes an input circuit, a first pull-down circuit, a second pull-down circuit, and an output circuit. In a first state, the first pull-down circuit is configured to pull down the level of a pull-up node, and the second pull-down circuit is configured to pull down a level of the output terminal.

17 Claims, 8 Drawing Sheets

(51) Int. Cl.
*G09G 3/20* (2006.01)
*G09G 3/36* (2006.01)

(52) U.S. Cl.
CPC ............... *G09G 2300/0809* (2013.01); *G09G 2310/0286* (2013.01); *G09G 2310/08* (2013.01)

(56) References Cited

U.S. PATENT DOCUMENTS

| | | | | |
|---|---|---|---|---|
| 2014/0098015 A1* | 4/2014 | Wang | ................... | G09G 3/3677 345/100 |
| 2015/0043703 A1* | 2/2015 | Tan | ................... | G11C 19/28 377/68 |
| 2015/0213762 A1* | 7/2015 | Xia | ................... | G09G 3/3266 345/215 |
| 2015/0280704 A1* | 10/2015 | Wu | ................... | G09G 3/3677 345/100 |
| 2015/0371716 A1* | 12/2015 | Shao | ................... | G11C 19/287 345/100 |
| 2016/0125955 A1* | 5/2016 | Pang | ................... | G11C 19/287 377/64 |
| 2016/0187917 A1* | 6/2016 | Lou | ................... | G09G 3/2096 345/213 |
| 2016/0225336 A1* | 8/2016 | Gu | ................... | G11C 19/28 |
| 2016/0275902 A1* | 9/2016 | Xue | ................... | G09G 5/003 |
| 2016/0314850 A1* | 10/2016 | Gu | ................... | G11C 19/28 |
| 2016/0372063 A1* | 12/2016 | Li | ................... | G11C 19/28 |
| 2017/0039971 A1* | 2/2017 | Huang | ................... | G09G 3/3677 |
| 2017/0256220 A1 | 9/2017 | Huang | | |
| 2017/0345515 A1 | 11/2017 | Shang | | |
| 2018/0122289 A1* | 5/2018 | Gu | ................... | G09G 3/2092 |

FOREIGN PATENT DOCUMENTS

CN 104778928 A 7/2015
CN 105161134 A 12/2015

* cited by examiner

SHIFT REGISTER UNIT AND DRIVING METHOD THEREOF, GATE DRIVING CIRCUIT AND DISPLAY APPARATUS

CROSS REFERENCE TO RELATED APPLICATION

The present application claims the priority of Chinese patent application No. 201710670316.5 filed on Aug. 8, 2017, and the entire content disclosed by the Chinese patent application is incorporated herein by reference as part of the present application.

TECHNICAL FIELD

Embodiments of the present disclosure relate to a shift register unit and a driving method thereof, a gate driving circuit and a display apparatus.

BACKGROUND

In the field of display technology, for example, a pixel array of a liquid crystal display generally includes rows of gate lines and columns of data lines that intersect with each other. Driving of the gate lines can be implemented by an integrated driving circuit amounted on an array substrate. In recent years, with the continuous improvement of an amorphous silicon thin film process, a gate driving circuit can also be directly fabricated on a thin film transistor array substrate to form a GOA (Gate driver On Array) to drive gate lines.

For example, the GOA formed of a plurality of cascaded shift register units can be used to provide switching voltage signals for the rows of gate lines of a pixel array, thereby controlling the rows of gate lines to be turned on sequentially. Data signals are provided by data lines to the pixel units of a corresponding row in the pixel array in each period, thereby forming gray voltages required for displaying each grayscale of an image, and displaying each frame of the image.

SUMMARY

At least one embodiment of the present disclosure provides a shift register unit, comprising an input circuit, a first pull-down circuit, a second pull-down circuit, and an output circuit. The input circuit is coupled to a pull-up node, an input signal terminal, a first level signal terminal, a reset signal terminal and a second level signal terminal, and is configured to charge the pull-up node; the output circuit is coupled to the pull-up node, a first clock signal terminal and an output terminal, and is configured to output a signal inputted by the first clock signal terminal to the output terminal under control of a level of the pull-up node; the first pull-down circuit is coupled to the pull-up node, a first level power signal terminal and a third level signal terminal; and the second pull-down circuit is coupled to the first clock signal terminal, a second clock signal terminal, the first level power signal terminal and the output terminal. In a first state, the first pull-down circuit is configured to pull down the level of the pull-up node, and the second pull-down circuit is configured to pull down a level of the output terminal.

For example, in a shift register unit provided by an embodiment of the present disclosure, the first pull-down circuit comprises a first transistor. A gate electrode of the first transistor is coupled to the third level signal terminal, a first electrode of the first transistor is coupled to the pull-up node, and a second electrode of the first transistor is coupled to the first level power signal terminal.

For example, in a shift register unit provided by an embodiment of the present disclosure, the second pull-down circuit comprises a second transistor and a third transistor. A gate electrode of the second transistor is coupled to the first clock signal terminal, a first electrode of the second transistor is coupled to a second electrode of the third transistor, and a second electrode of the second transistor is coupled to the output terminal; a gate electrode of the third transistor is coupled to the second clock signal terminal, and a first electrode of the third transistor is coupled to the first level power signal terminal.

For example, in a shift register unit provided by an embodiment of the present disclosure, both the second transistor and the third transistor are p-type transistors.

For example, in a shift register unit provided by an embodiment of the present disclosure, the input circuit comprises a fourth transistor and a fifth transistor. A gate electrode of the fourth transistor is coupled to the input signal terminal, a first electrode of the fourth transistor is coupled to the first level signal terminal, and a second electrode of the fourth transistor is coupled to the pull-up node; a gate electrode of the fifth transistor is coupled to the reset signal terminal, a first electrode of the fifth transistor is coupled to the pull-up node, and a second electrode of the fifth transistor is coupled to the second level signal terminal.

For example, in a shift register unit provided by an embodiment of the present disclosure, the output circuit comprises a sixth transistor and a first capacitor. A gate electrode of the sixth transistor is coupled to the pull-up node, a first electrode of the sixth transistor is coupled to the first clock signal terminal, and a second electrode of the sixth transistor is coupled to the output terminal; a first end of the first capacitor is coupled to the pull-up node, and a second end of the first capacitor is coupled to the output terminal.

For example, a shift register unit provided by an embodiment of the present disclosure further comprises a third pull-down driving circuit and a third pull-down circuit. The third pull-down driving circuit is coupled to a pull-down node, the pull-up node, the first level power signal terminal and the second clock signal terminal, and is configured to control a level of the pull-down node in a second state; and the third pull-down circuit is coupled to the pull-down node, the pull-up node, the first level power signal terminal and the output terminal, and is configured to pull down the level of the pull-up node and the level of the output terminal under control of the level of the pull-down node in the second state.

For example, in a shift register unit provided by an embodiment of the present disclosure, the third pull-down circuit comprises a seventh transistor and an eighth transistor. A gate electrode of the seventh transistor is coupled to the pull-down node, a first electrode of the seventh transistor is coupled to the output terminal, and a second electrode of the seventh transistor is coupled to the first level power signal terminal; and a gate electrode of the eighth transistor is coupled to the pull-down node, a first electrode of the eighth transistor is coupled to the pull-up node, and a second electrode of the eighth transistor is coupled to the first level power signal terminal.

For example, in a shift register unit provided by an embodiment of the present disclosure, the third pull-down driving circuit comprises a ninth transistor and a tenth transistor. A gate electrode and a first electrode of the seventh transistor are coupled to the second clock signal terminal, and a second electrode of the ninth transistor is coupled to the pull-down node; and a gate electrode of the tenth transistor is coupled to the pull-up node, a first electrode of the tenth transistor is coupled to the pull-down node, and a second electrode of the tenth transistor is coupled to the first level power signal terminal.

For example, in a shift register unit provided by an embodiment of the present disclosure, the third pull-down driving circuit further comprises an eleventh transistor. A gate electrode of the eleventh transistor is coupled to the output terminal, a first electrode of the eleventh transistor is coupled to the pull-down node, and a second electrode of the eleventh transistor is coupled to the first level power signal terminal.

At least one embodiment of the present disclosure further provides a gate driving circuit, comprising a plurality of cascaded shift register units each of which is provided by the embodiments of the present disclosure.

At least one embodiment of the present disclosure further provides a display apparatus, comprising the gate driving circuit provided by the embodiments of the present disclosure.

At least one embodiment of the present disclosure further provides a driving method of the shift register unit provided by the embodiments of the present disclosure, comprising: in the first state, the first pull-down circuit pulling down the level of the pull-up node, and the second pull-down circuit pulling down the level of the output terminal.

For example, a driving method provided by an embodiment of the present disclosure further comprises: in a second display state, in a first stage, the input signal terminal being at a high level, the reset signal terminal being at a low level, the second level signal terminal being at a low level, the first level signal terminal being at a high level, the first clock signal terminal being at a low level, and the second clock signal terminal being at a high level; the input circuit charging the pull-up node, the output terminal outputting a signal inputted by the first clock signal terminal, and the third pull-down driving circuit pulling down the level of the pull-down node.

In a second stage, the input signal terminal is at a low level, the reset signal terminal is at a low level, the second level signal terminal is at a low level, the first level signal terminal is at a high level, the first clock signal terminal is at a high level, and the second clock signal terminal is at a low level; the output terminal outputs a signal inputted by the first clock signal terminal, and the third pull-down driving circuit pulls down the level of the pull-down node.

In a third stage, the input signal terminal is at a low level, the reset signal terminal is at a high level, the second level signal terminal is at a low level, the first level signal terminal is at a high level, the first clock signal terminal is at a low level, and the second clock signal terminal is at a high level; the input circuit pulls down the level of the pull-up node, the third pull-down driving circuit pulls up the level of the pull-down node, and the third pull-down circuit pulls down the level of the output terminal to be approximately the same as the first level power signal terminal. The first pull-down circuit and the second pull-down circuit are in a turn-off state in the second state.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the display panel technology, a GOA (Gate driver On Array) technology can be adopted, that is, a gate driving circuit is integrated on a display panel through a thin film transistor manufacturing process, so advantages such as a narrow bezel and a reduction in assembly cost can be realized. The display panel can be a liquid crystal display (LCD) panel or an organic light emitting diode (OLED) display panel.

Figure 1:
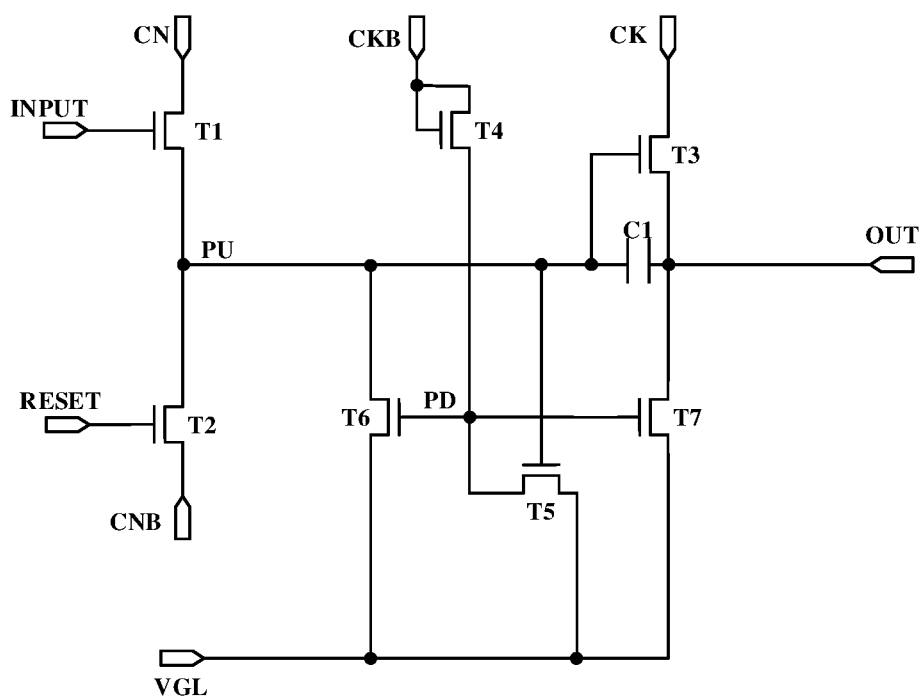
FIG. 1 is a schematic circuit diagram of a shift register unit.
Figure 2:
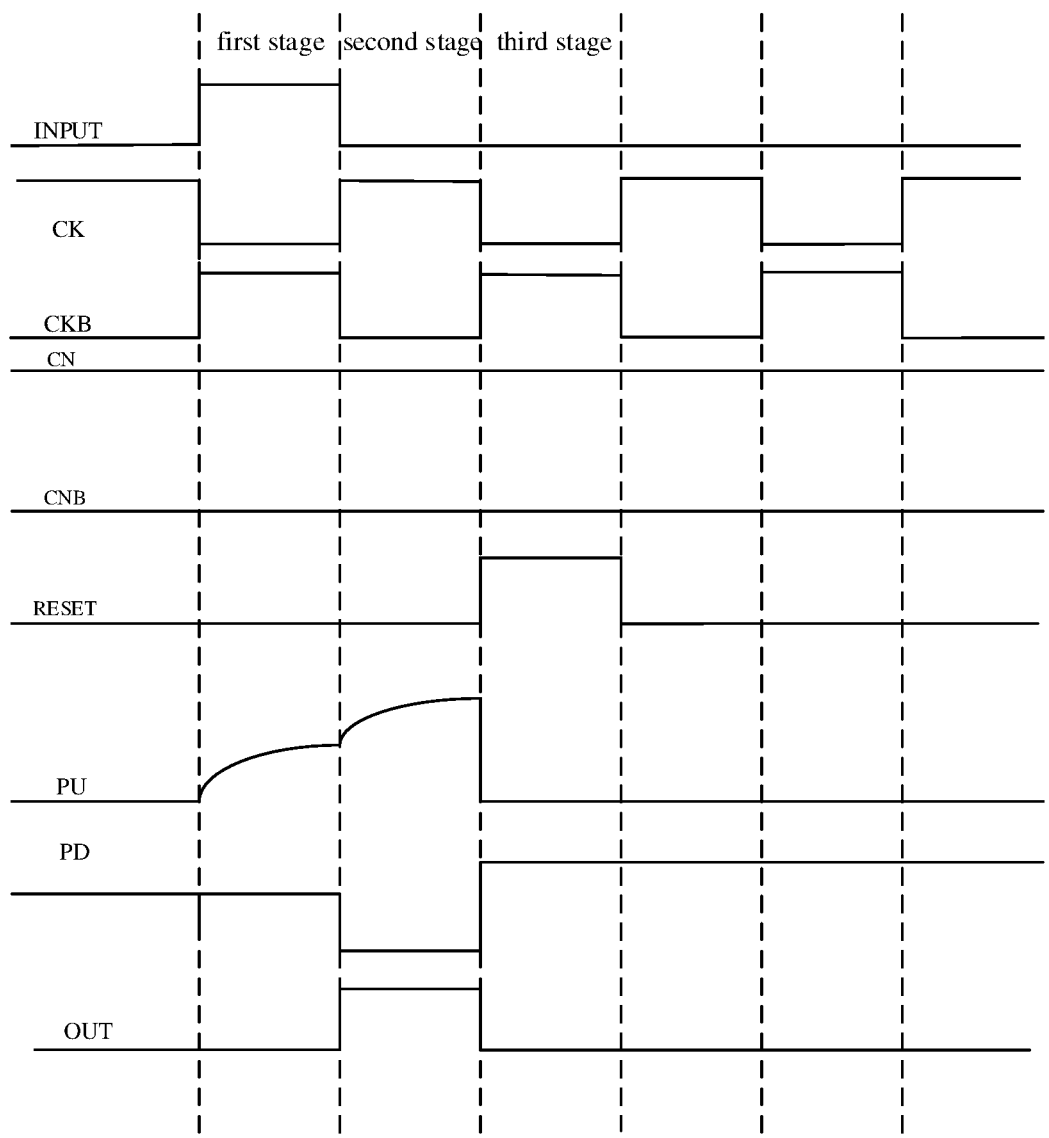
FIG. 2 is a signal timing diagram corresponding to the operation of the shift register unit as shown in FIG. 1.

FIG. 1 shows a circuit structure of a shift register unit, and the shift register unit can be cascaded to form a gate driving circuit. As shown in FIG. 1, the shift register unit includes seven transistors (T1 to T7) and a first capacitor (C1). FIG. 2 is a signal timing diagram corresponding to the operation of the shift register unit in FIG. 1. The gate driving circuit formed by the shift register units as shown in FIG. 1 provides switching voltage signals to rows of gate lines of a display panel, thereby controlling the rows of gate lines to be turned on sequentially. However, when the display panel enters, for example, a screen saver state, the shift register units in each stage of the gate driving circuit still maintain a normal display working state, and scan all the regions of the display panel, resulting in large power consumption.

It should be noted that, in the embodiments of the present disclosure, the screen saver state of the display panel is different from the normal display working state. For example, when the display panel is in the screen saver state, the screen of at least a portion of the display panel remains stationary or does not display images; for example, a portion of the display panel in the screen saver state can be used to display time information, weather information, picture information, or other kind of content. In this aspect, the following embodiments are the same as the above and will not be described again.

At least one embodiment of the present disclosure provides a shift register unit including an input circuit, a first pull-down circuit, a second pull-down circuit, and an output circuit. The input circuit is coupled to a pull-up node, an input signal terminal, a first level signal terminal, a reset signal terminal and a second level signal terminal, and is configured to charge the pull-up node; the output circuit is coupled to the pull-up node, a first clock signal terminal and an output terminal, and is configured to output a signal inputted by the first clock signal terminal to the output terminal under the control of a level of the pull-up node; the first pull-down circuit is coupled to the pull-up node, a first level power signal terminal and a third level signal terminal; and the second pull-down circuit is coupled to the first clock signal terminal, a second clock signal terminal, the first level power signal terminal and the output terminal. In a first state, the first pull-down circuit is configured to pull down the level of the pull-up node, and the second pull-down circuit is configured to pull down a level of the output terminal.

At least one embodiment of the present disclosure further provides a gate driving circuit, a display apparatus and a driving method corresponding to the above-described shift register unit.

When the display panel is in the first state, the shift register unit, the gate driving circuit, the display apparatus and the driving method provided in the embodiments of the present disclosure can pull down the level of the pull-up node and the level of the output terminal through the first pull-down circuit and the second pull-down circuit respectively, so the screen of at least a portion region of the display panel remains stationary or does not display images, thereby reducing power consumption.

It should be noted that in the description for the embodiments of the present disclosure, a second state of the display panel indicates that the display panel is in a normal display working state, and in the second state, for example, all regions of the display panel perform display line by line. The first state of the display panel is different from the normal display working state (for example, the display panel is in the screen saver state). In the first state, the screen of at least a portion of the display panel remains stationary or does not display images.

The embodiments of the present disclosure and examples thereof will be described in detail below with reference to the accompanying drawings.

Figure 3:
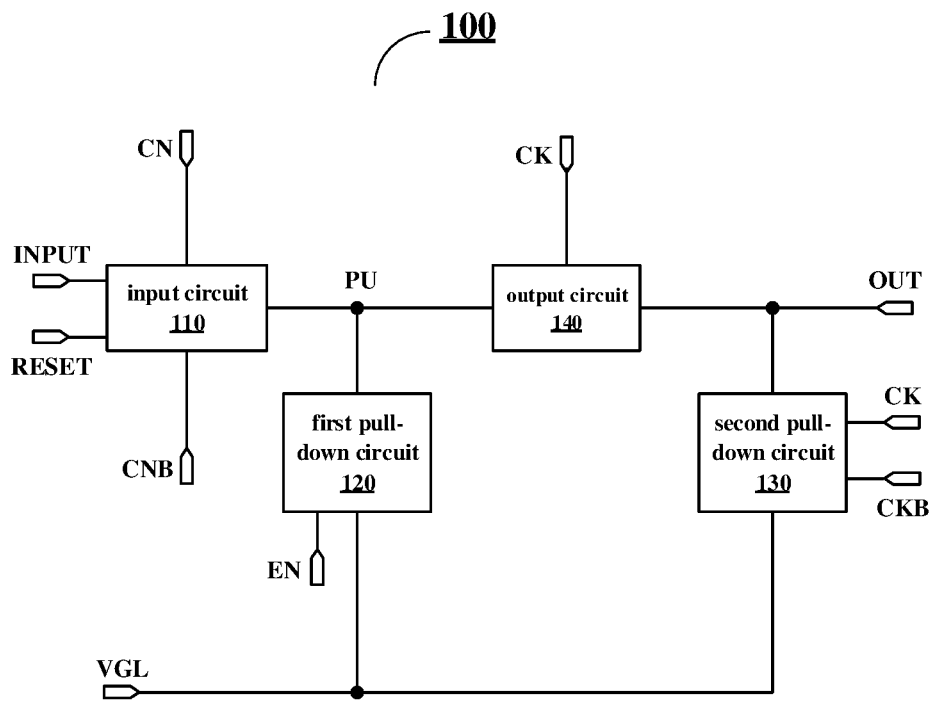
FIG. 3 is a schematic block diagram of a shift register unit according to an embodiment of the present disclosure.

An embodiment of the present disclosure provides a shift register unit 100, as shown in FIG. 3, the shift register unit 100 includes an input circuit 110, a first pull-down circuit 120, a second pull-down circuit 130, and an output circuit 140.

The input circuit 110 is coupled to a pull-up node PU, an input signal terminal INPUT, a first level signal terminal CN, a reset signal terminal RESET and a second level signal terminal CNB, and is configured to charge the pull-up node PU. For example, in a forward scanning, the input circuit 110 is configured to enable that the first level signal terminal CN is electrically coupled to the pull-up node PU, thereby a high level inputted by the first level signal terminal CN can charge the pull-up node PU. For another example, in a reverse scanning, the input circuit 110 is configured to enable that the second level signal terminal CNB is electrically coupled to the pull-up node PU, thereby a high level inputted by the second level signal terminal CNB can charge the pull-up node.

It should be noted that the shift register unit 100 as shown in FIG. 3 can implement a bi-directional scanning, i.e., the scanning mode including the forward scanning and the reverse scanning. For example, when the first level signal terminal CN maintains inputting a DC high level signal and the second level signal terminal CNB maintains inputting a DC low level signal, the forward scanning can be realized. When the first level signal terminal CN maintains inputting a DC low level signal and the second level signal terminal CNB maintains inputting a DC high level signal, the reverse scanning can be realized. It should be noted that the forward scanning and the reverse scanning in the present disclosure are described relatively.

The output circuit 140 is coupled to the pull-up node PU, a first clock signal terminal CK and an output terminal OUT, and is configured to output a signal inputted by the first clock signal terminal CK to the output terminal OUT under the control of a level of the pull-up node PU.

The first pull-down circuit 120 is coupled to the pull-up node PU, a low level power signal terminal VGL and a third level signal terminal EN. For example, in the first state, a signal inputted by the third level signal terminal EN can control the first pull-down circuit 120 to be turned on, thereby the first pull-down circuit 120 enable the pull-up node PU to be electrically coupled to the low level power signal terminal VGL, thereby a low level inputted by the low level power signal terminal VGL pulls down the level of the pull-up node. In the embodiment of the present disclosure, for example, the low level power signal terminal VGL is configured to maintain inputting a DC low level signal, and the following embodiments are the same in this aspect and will not be described again.

The second pull-down circuit 130 is coupled to the first clock signal terminal CK, a second clock signal terminal CKB, the low level power signal terminal VGL and the output terminal OUT. For example, in the first state, signals inputted by the first clock signal terminal CK and the second clock signal terminal CKB can control the second pull-down circuit 130 to be turned on, thereby the second pull-down circuit 130 enable the output terminal OUT to be electrically coupled to the low level power signal terminal VGL, thereby the low level inputted by the low level power signal terminal VGL pulls down the level of the output terminal OUT. The low level power signal terminal VGL is an example of the first level power signal terminal mentioned above and cooperates with the first pull-down circuit 120 or second pull-down circuit 130 to pull down the level of the pull-up node PU.

In a first state, the first pull-down circuit 120 and the second pull-down circuit 130 are turned on, the first pull-down circuit 120 is configured to pull down the level of the pull-up node PU, and the second pull-down circuit 130 is configured to pull down the level of the output terminal OUT.

A plurality of shift register units 100 as shown in FIG. 3 can be cascaded to form a gate driving circuit for driving a display panel to perform display line by line for example. For example, output terminals OUT of the shift register units 100 of the respective stages are electrically coupled to pixel units of corresponding rows through gate lines, and are used to control the turning-on and turning-off of the pixel units of the corresponding rows. In the first state, for each of some selected shift register units, by controlling the first pull-down circuit 120 and the second pull-down circuit 130 to be turned on, the level of the pull-up node PU and the level of the output terminal OUT are both pulled down to a low level, thus the corresponding region in the display panel controlled by the selected shift register units 100 enters a low power consumption mode, and this region remains stationary or does not display images, thereby reducing power consumption.

Figure 4:
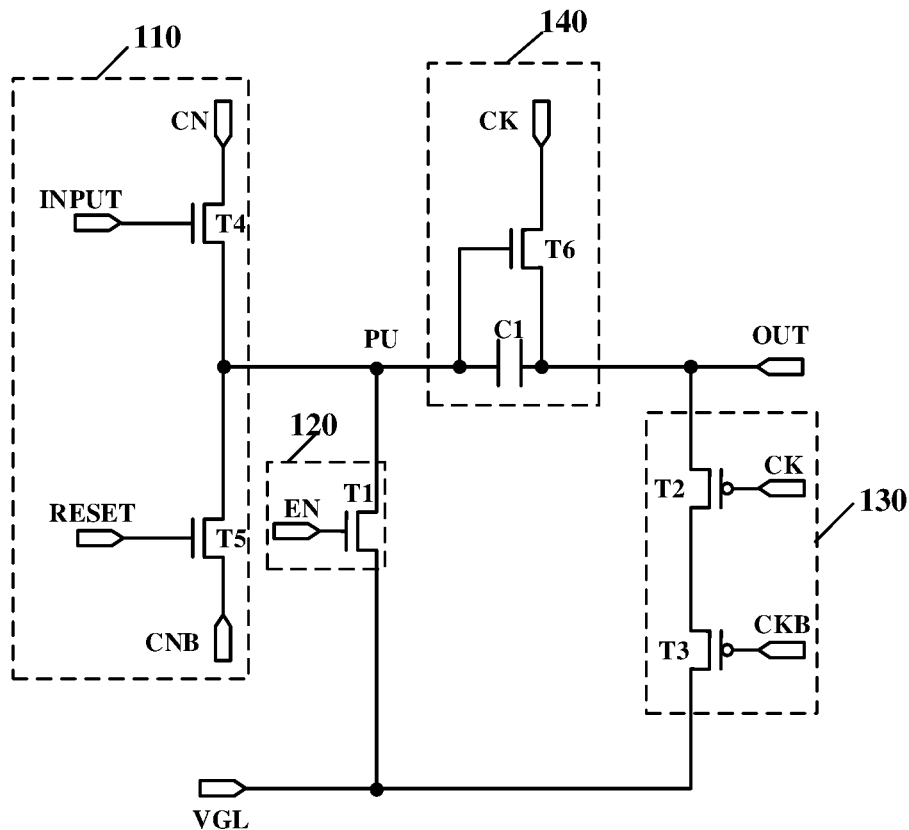
FIG. 4 is a schematic circuit diagram of an implementation example of the shift register unit as shown in FIG. 3.

For example, in one example, the shift register unit 100 as shown in FIG. 3 can be implemented in the circuit structure as shown in FIG. 4.

As shown in FIG. 4, the first pull-down circuit 120 can be implemented as a first transistor T1. A gate electrode of the first transistor T1 is coupled to the third level signal terminal EN, a first electrode of the first transistor T1 is coupled to the pull-up node PU, and a second electrode of the first transistor T1 is coupled to the low level power signal terminal VGL.

As shown in FIG. 4, the second pull-down circuit 130 can be implemented to include a second transistor T2 and a third transistor T3. A gate electrode of the second transistor T2 is coupled to the first clock signal terminal CK, a first electrode of the second transistor T2 is coupled to a second electrode of the third transistor T3, and a second electrode of the second transistor T2 is coupled to the output terminal OUT; a gate electrode of the third transistor T3 is coupled to the second clock signal terminal CKB, and a first electrode of the third transistor T3 is coupled to the low level power signal terminal VGL.

For example, in the example as shown in FIG. 4, both the second transistor T2 and the third transistor T3 are p-type transistors. In this way, in the first state, low level signals inputted by the first clock signal terminal CK and the second clock signal terminal CKB (for example, the level of the signal is 0V, −5V, −10V or other appropriate level) can control the second transistor T2 and the third transistor T3 to be turned on, thereby the level of the output terminal OUT is pulled down to a low level as well. Because in the first state, signals inputted by the first clock signal terminal CK and the second clock signal terminal CKB are low level signals, power consumption can be further reduced.

As shown in FIG. 4, the input circuit 110 can be implemented to include a fourth transistor T4 and a fifth transistor T5. A gate electrode of the fourth transistor T4 is coupled to the input signal terminal INPUT, a first electrode of the fourth transistor T4 is coupled to the first level signal terminal CN, and a second electrode of the fourth transistor T4 is coupled to the pull-up node PU; a gate electrode of the fifth transistor T5 is coupled to the reset signal terminal RESET, a first electrode of the fifth transistor T5 is coupled to the pull-up node PU, and a second electrode of the fifth transistor T5 is coupled to the second level signal terminal CNB.

As shown in FIG. 4, the output circuit 140 can be implemented to include a sixth transistor T6 and a first capacitor C1. A gate electrode of the sixth transistor T6 is coupled to the pull-up node PU, a first electrode of the sixth transistor T6 is coupled to the first clock signal terminal CK, and a second electrode of the sixth transistor T6 is coupled to the output terminal OUT; a first end of the first capacitor C1 is coupled to the pull-up node PU, and a second end of the first capacitor C1 is coupled to the output terminal OUT.

Figure 5:
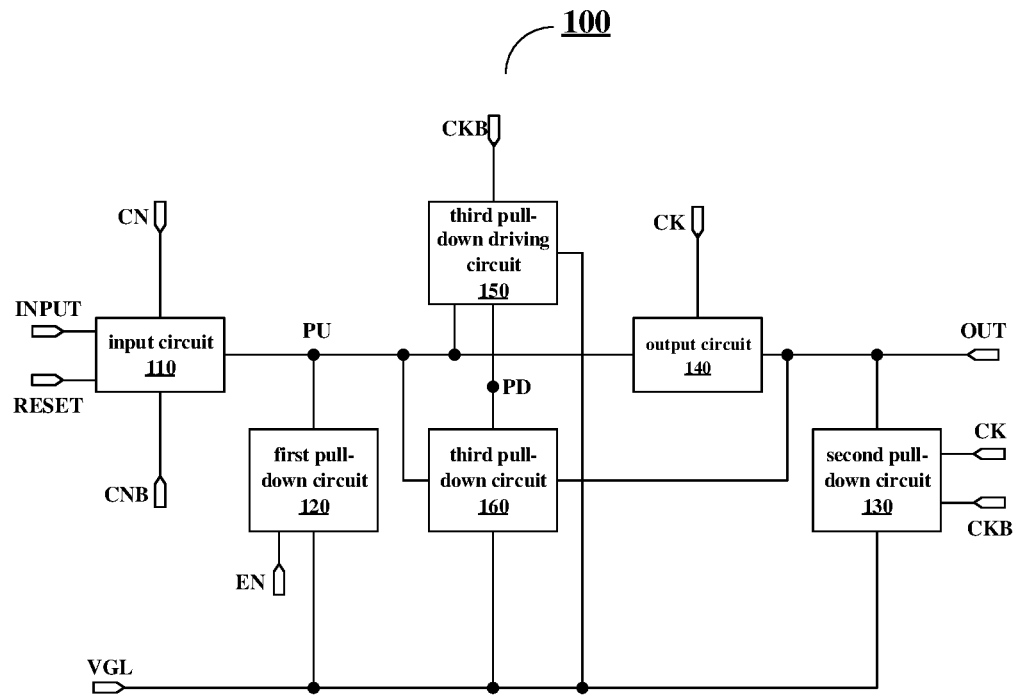
FIG. 5 is a schematic block diagram of another shift register unit according to an embodiment of the present disclosure.

In the shift register unit 100 provided by another embodiment of the present disclosure, as shown in FIG. 5, the shift register unit 100 further includes a third pull-down driving circuit 150 and a third pull-down circuit 160.

The third pull-down driving circuit 150 is coupled to a pull-down node PD, the pull-up node PU, the low level power signal terminal VGL and the second clock signal terminal CKB, and is configured to control a level of the pull-down node PD in the second state. For example, a high level signal inputted by the second clock signal terminal CKB can charge the pull-down node PD. For another example, the third pull-down driving circuit 150 enable the pull-down node PD to be electrically coupled to the low level power signal terminal VGL under the control of the level of the pull-up node PU, thereby pulling down the level of the pull-down node PD.

The third pull-down circuit 160 is coupled to the pull-down node PD, the pull-up node PU, the low level power signal terminal VGL and the output terminal OUT, and is configured to pull down the level of the pull-up node PU and the level of the output terminal OUT under the control of the level of the pull-down node PD in the second state.

Figure 8:
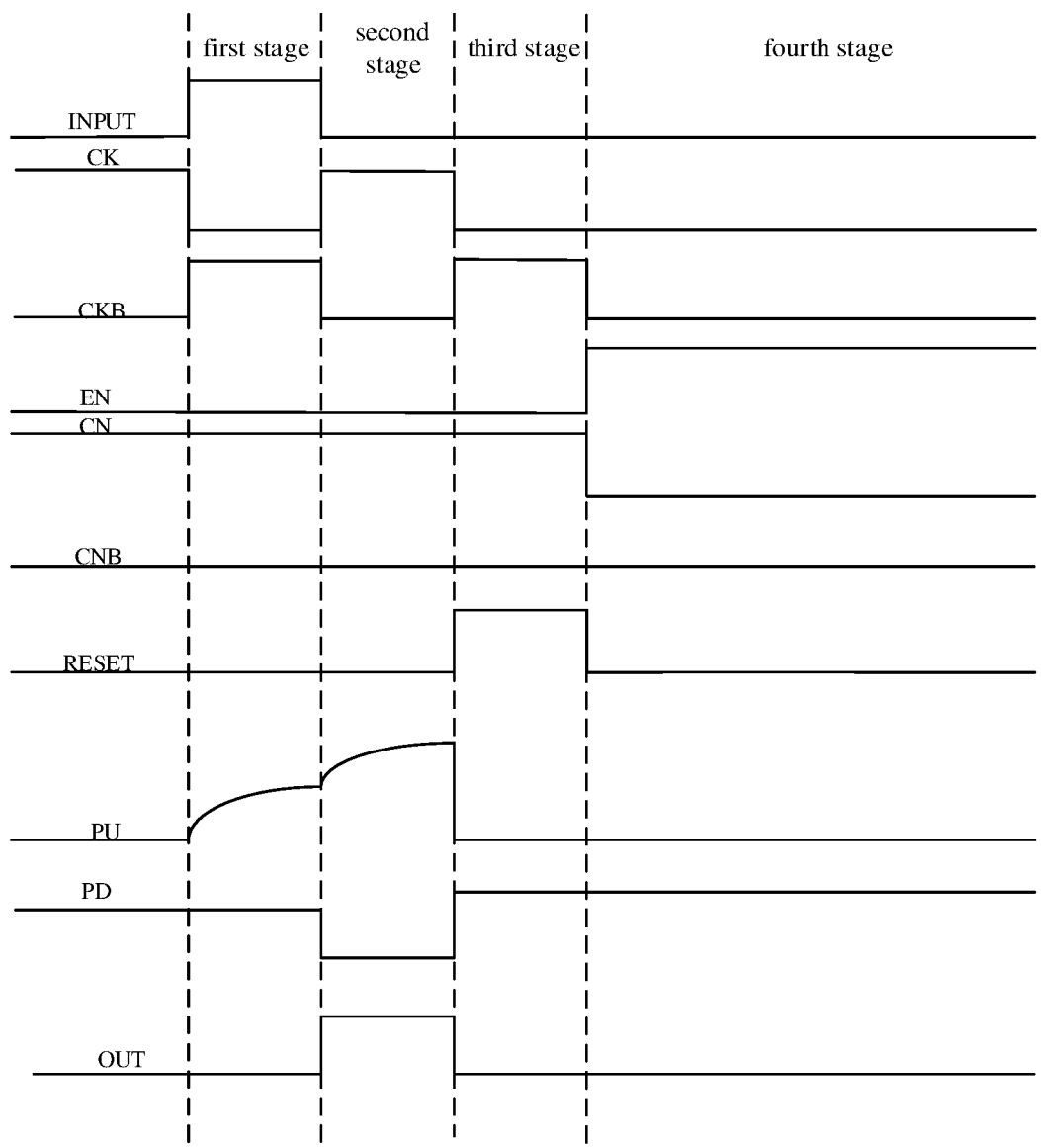
FIG. 8 is a signal timing diagram corresponding to the operation of the shift register unit as shown in FIG. 7.

For example, the second state is the state in which the display panel displays normally before the display panel enters the first state (for example, a screen saver state). The operation principle of the shift register unit 100 as shown in FIG. 5 in the second state will be described below in combination with a signal timing diagram as shown in FIG. 8.

In a first stage, the input signal terminal INPUT is at a high level, the reset signal terminal RESET is at a low level, the second level signal terminal CNB is at a low level, the first level signal terminal CN is at a high level, the input circuit 110 is turned on, the high level inputted by the first level signal terminal CN can charge the pull-up node PU, and the level of the pull-up node PU is pulled up to a high level; the high level of the pull-up node PU can control the output circuit 140 to be turned on, the first clock signal terminal CK is at a low level, and the output terminal OUT outputs the low level of the first clock signal terminal CK, that is, outputs the signal inputted by the first clock signal terminal CK; the second clock signal terminal CKB is at a high level, the level of the pull-down node PD is pulled down under the control of the third pull-down driving circuit 150, and the third pull-down circuit 160 is turned off.

In a second stage, the input signal terminal INPUT is at a low level, the reset signal terminal RESET is at a low level, the second level signal terminal CNB is at a low level, the first level signal terminal CN is at a high level, the input circuit 110 is turned off; and under the control of the output circuit 140, the level of the pull-up node PU is further pulled up due to the bootstrap action. The output circuit 140 remains in a turn-on state, the first clock signal terminal CK is at a high level, and the output terminal OUT outputs the high level of the first clock signal terminal CK. For example, the high level signal of the output terminal OUT can be provided to a gate line of a display panel, thereby driving the pixel units coupled to the gate line to display. The second clock signal terminal CKB is at a low level, the level of the pull-down node PD is further pulled down under the control of the third pull-down driving circuit 150, and the third pull-down circuit 160 is turned off.

In a third stage, the input signal terminal INPUT is at a low level, the reset signal terminal RESET is at a high level, the second level signal terminal CNB is at a low level, the first level signal terminal CN is at a high level, the input circuit 110 is turned on, the level of the pull node PU is pulled down by the low level of the second level signal terminal CNB; the first clock signal terminal CK is at a high level, and the low level of the pull-up node PU enable the output circuit 140 to be turned off; the second clock signal terminal CKB is at a high level; under the control of the third pull-down driving circuit 150, the level of the pull-down node PD is pulled up by the high level of the second clock signal terminal CKB, the high level of the pull-down node PD can control the third pull-down circuit 160 to be turned on, thereby the third pull-down circuit 160 can pull down the level of the output terminal OUT to the low level that is the same as the low level power signal terminal VGL, and the third pull-down circuit 160 can further pull down the level of the pull-up node PU.

The first pull-down circuit 120 and the second pull-down circuit 130 are in a turn-off state in the second state.

In the first state, the shift register unit 100 provided by the embodiment of the present disclosure enable both the level of the pull-up node PU and the level of the output terminal OUT to be pulled down to a low level by controlling the first pull-down circuit 120 and the second pull-down circuit 130 to be turned on, thus the corresponding region in the display panel controlled by the shift register unit 100 enters a low power consumption mode, and this region remains stationary or does not display images, thereby reducing power consumption.

Figure 6:
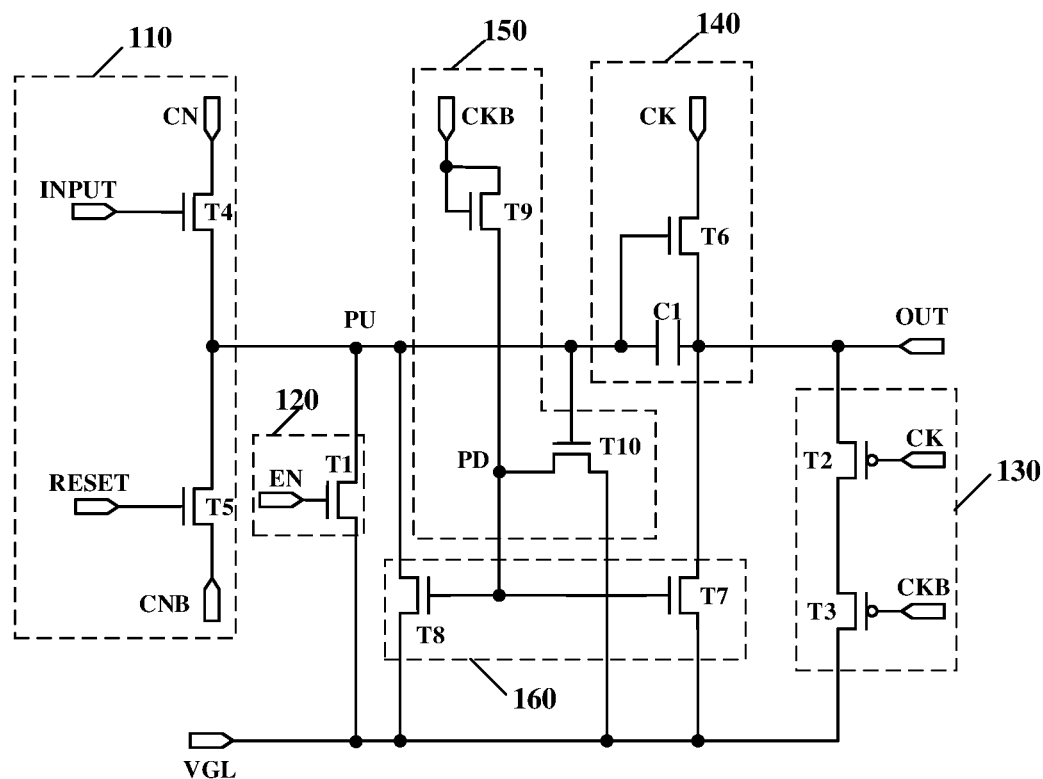
FIG. 6 is a schematic circuit diagram of an implementation example of the shift register unit as shown in FIG. 5.

For example, in one example, the shift register unit 100 as shown in FIG. 5 can be implemented in a circuit structure as shown in FIG. 6.

As shown in FIG. 6, the third pull-down circuit 160 can be implemented to include a seventh transistor T7 and an eighth transistor T8. A gate electrode of the seventh transistor T7 is coupled to the pull-down node PD, a first electrode of the seventh transistor T7 is coupled to the output terminal OUT, and a second electrode of the seventh transistor T7 is coupled to the low level power signal terminal VGL; and a gate electrode of the eighth transistor T8 is coupled to the pull-down node PD, a first electrode of the eighth transistor T8 is coupled to the pull-up node PU, and a second electrode of the eighth transistor T8 is coupled to the low level power signal terminal VGL.

As shown in FIG. 6, the third pull-down driving circuit 150 can be implemented to include a ninth transistor T9 and a tenth transistor T10. A gate electrode and a first electrode of the seventh transistor T9 are coupled to the second clock signal terminal CKB, and a second electrode of the ninth transistor T9 is coupled to the pull-down node PD; and a gate electrode of the tenth transistor T10 is coupled to the pull-up node PU, a first electrode of the tenth transistor T10 is coupled to the pull-down node PD, and a second electrode of the tenth transistor T10 is coupled to the low level power signal terminal VGL.

Figure 7:
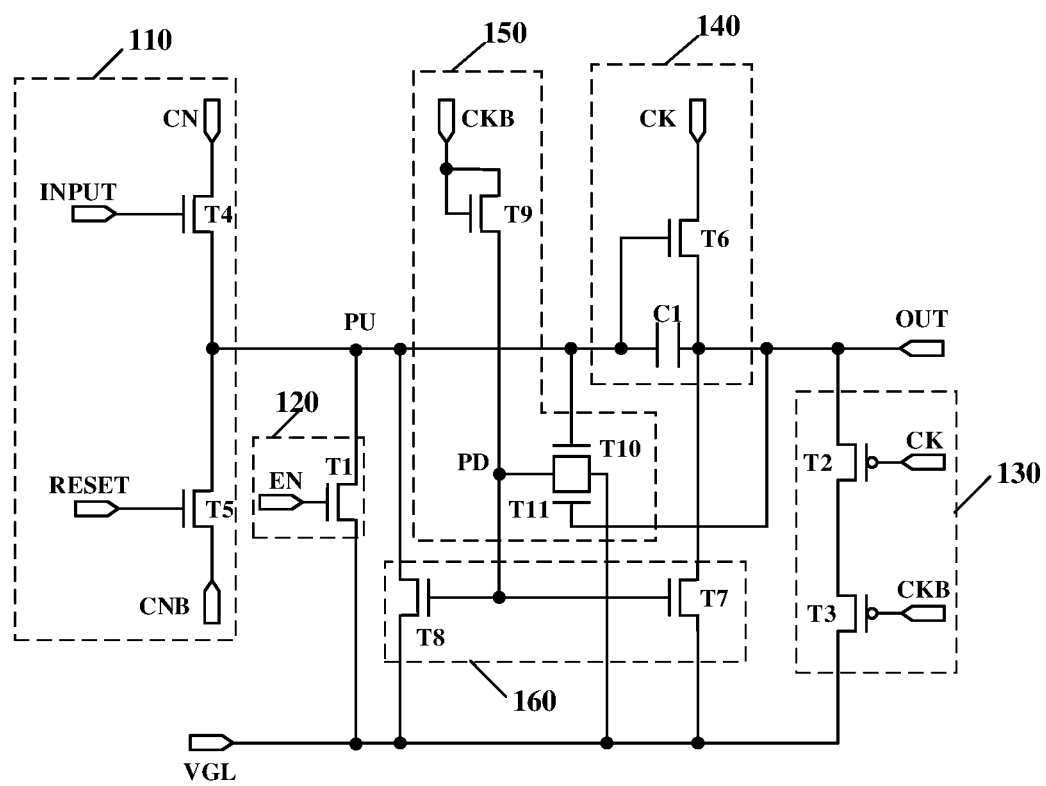
FIG. 7 is a schematic circuit diagram of another implementation example of the shift register unit as shown in FIG. 5.

For example, in another example, as shown in FIG. 7, the third pull-down driving circuit 150 further includes an eleventh transistor T11 in addition to the ninth transistor T9 and the tenth transistor T10. A gate electrode of the eleventh transistor T11 is coupled to the output terminal OUT, a first electrode of the eleventh transistor T11 is coupled to the pull-down node PD, and a second electrode of the eleventh transistor T11 is coupled to the low level power signal terminal VGL. When the output terminal OUT is at a high level, the eleventh transistor T11 is turned on and can further pull down the level of the pull-down node PD.

It should be noted that, regarding the detailed description about the input circuit 110, the first pull-down circuit 120, the second pull-down circuit 130, and the output circuit 140 as shown in FIGS. 6 and 7, reference can be made to the corresponding descriptions about the shift register unit 100 as shown in FIG. 4, and details are not described herein again.

It should be noted that, in the embodiments of the present disclosure, the high level and the low level inputted by each terminal are described relatively. The high level represents a relatively higher voltage range (for example, the high level can adopt 5V, 10V, or other appropriate voltage), and multiple high levels of multiple terminals can be same or different. Similarly, the low level indicates a lower voltage range (for example, the low level can adopt 0V, −5V, −10V, or other appropriate voltage), and multiple low levels of multiple terminals can be same or different. For example, the minimum value of the high level is greater than the maximum value of the low level.

It should be noted that the transistors in the embodiments of the present disclosure can adopt thin film transistors, field-effect transistors or other switching devices with the same characteristics. In the embodiments of the present disclosure, thin film transistors are adopted as an example for description. Source electrodes and drain electrodes of the transistors adopted herein can be symmetrical in structure, so the source electrodes and drain electrodes can not be different structurally. In the embodiment of the present disclosure, in order to distinguish between two electrodes of a transistor other than a gate electrode, it is directly described that one of the two electrodes is a first electrode and the other electrode is a second electrode.

In addition, the transistors can be divided into n-type transistors or p-type transistors according to characteristics of the transistors. When a transistor is a p-type transistor, turn-on voltage of the transistor is a low-level voltage (for example, 0V, −5V, −10V, or other appropriate voltage), and turn-off voltage of the transistor is a high-level voltage (for example, 5V, 10V, or other appropriate voltage). When a transistor is an n-type transistor, turn-on voltage of the transistor is a high-level voltage (for example, 5V, 10V, or other appropriate voltage), and turn-off voltage of the transistor is a low-level voltage (for example, 0V, −5V, −10V, or other appropriate voltage).

For example, as shown in FIG. 7, the second transistor T2 and the third transistor T3 in the shift register unit 100 adopt p-type transistors, and other transistors adopt n-type transistors. Taking the forward scanning as an example, the first level signal terminal CN maintains inputting a DC high level signal, the second level signal terminal CNB maintains inputting a DC low level signal, and the low level power signal terminal VGL maintains inputting a DC low level signal.

The operation principle of the shift register unit 100 as shown in FIG. 7 will be described below in combination with a signal timing diagram as shown in FIG. 8 (illustrated by the forward scanning as an example), in a first stage, a second stage, a third stage and a fourth stage as shown in FIG. 8, the shift register unit 100 performs the following operations.

In the second state, that is, the region corresponding to the shift register unit 100 is displayed normally. For example, the shift register unit 100 is in the second state in all the first stage, the second stage and the third stage.

In the first stage, the input signal terminal INPUT is at a high level, the first level signal terminal CN is at a high level, the fourth transistor T4 is turned on, a high level inputted by the first level signal terminal CN charges the pull-up node PU, and the level of the pull-up node PU is pulled up to a high level; the high level of the pull-up node PU enables the sixth transistor T6 to be turned on, the first clock signal terminal CK is at a low level in this stage, and the output terminal OUT outputs the low level of the first clock signal terminal CK; the second clock signal terminal CKB is at a high level, the ninth transistor T9 is turned on, the high level inputted by the second level signal terminal CNB charges the pull-down node PD, and the high level of the pull-up node PU enables the tenth transistor T10 to be turned on, thereby the low level of the low level power signal terminal VGL can pull down the level of the pull-down PD. For example, in the design of the transistors, the ninth transistor T9 and the tenth transistor T10 can be configured (for example, aspect ratio, threshold voltages, etc. of these transistors) when the ninth transistor T9 and the tenth transistor T10 are both turned on, the level of the pull-down PD is pulled down to a lower level, which does not cause the seventh transistor T7 and the eighth transistor T8 to be turned on, thereby the seventh transistor T7 and the eighth transistor T8 can remain a turn-off state in this stage.

In the second stage, the first clock signal terminal CK is at a high level, and the sixth transistor T6 remains a turn-on state. Under the bootstrap action of the first capacitor C1, the level of the pull-up node PU is further pulled up, the sixth transistor T6 is turned on more sufficiently, and the output terminal OUT outputs the high level of the first clock signal terminal CK. In addition, in this stage, because the level of the pull-up node PU is further pulled up, the tenth transistor T10 can be turned on more sufficiently. At the same time, the high level of the output terminal OUT enables the eleventh transistor T11 to be turned on, and the cooperation of both transistors T10 and T11 enables the level of the pull-down node PD to be further pulled down.

In a third stage, the reset signal terminal RESET is at a high level, and this high level enables the fifth transistor T5 to be turned on. The low level of the second level signal terminal CNB pulls down the level of the pull-up node PU, and the sixth transistor T6 and the tenth transistor T10 are turned off. Because the pull-down node PD has no discharge path, the high level of the second clock signal terminal CKB charges the pull-down node PD and pulls up the level of the pull-down node PD to a high level. The high level of the pull-down node PD enable the seventh transistor T7 and the eighth transistor T8 to be turned on, the seventh transistor T7 pulls down the level of the output terminal OUT, and the eighth transistor T8 pulls down the level of the pull-up node PU.

In the above-described second state, the first transistor T1, the second transistor T2 and the third transistor T3 are all in a turn-off state, that is, the first pull-down circuit 120 and the second pull-down circuit 130 are in a turn-off state, which does not affect the level of the pull-up node PU and the level of the output terminal OUT.

After entering into the first state, for example, the fourth stage as shown in FIG. 8, the third level signal terminal EN is at a high level, the first transistor T1 is turned on, and at this time, the level of the pull-up node PU is pulled down to a low level. The first clock signal terminal CK and the second clock signal terminal CKB are both at low levels, the second transistor T2 and the third transistor T3 are turned on, and the level of the output terminal OUT is also pulled down to a low level. The region corresponding to the shift register unit 100 enters a low power consumption mode, for example, the region maintain displaying the state of the last frame, thereby reducing power consumption.

When a gate driving circuit formed by a plurality of shift register units 100 provided in the embodiments of the present disclosure drives a display panel, for example, in the second state, the display panel displays normally. When the display panel enters into the first state, for example, a portion region of the display panel enters into the screen saver state (for example, the portion region only displays time information), the gate driving circuit can be controlled to drive only the portion region to display, and pull down the pull-up nodes PUs and the output terminals OUTs of the shift register units 100 corresponding to other regions to a low level, which enables the other regions to keep a image stationary, thereby reducing power consumption.

Figure 9:
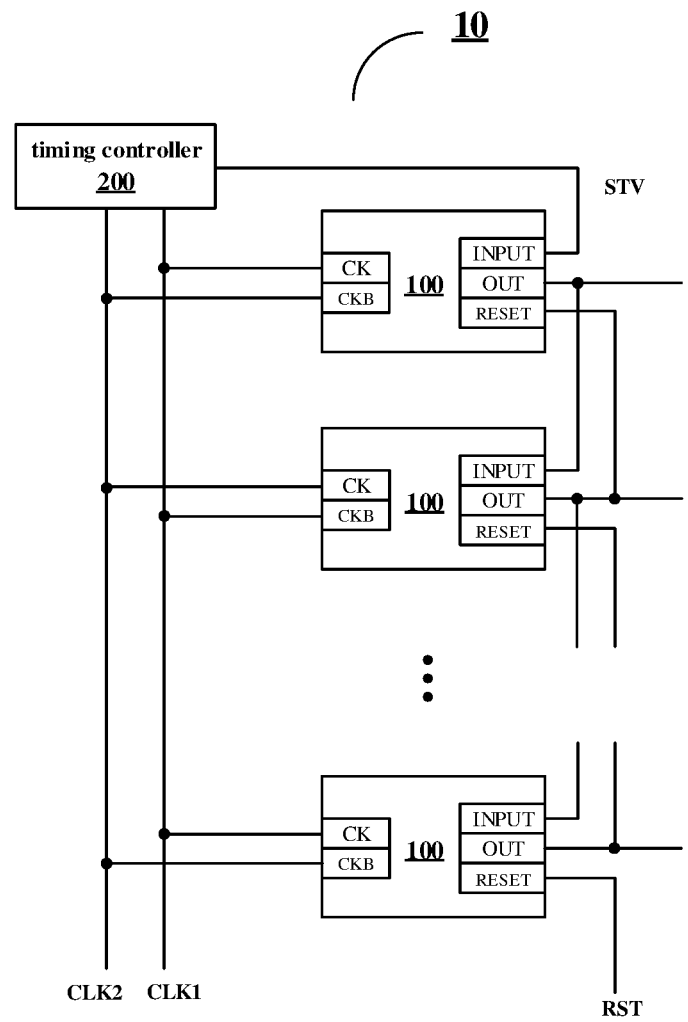
FIG. 9 is a schematic diagram of a gate driving circuit according to an embodiment of the present disclosure.

At least one embodiment of the present disclosure further provides a gate driving circuit 10, as shown in FIG. 9, the gate driving circuit 10 includes a plurality of cascaded shift register units 100. For example, the shift register units 100 each can adopt the shift register unit which is provided in any of the above-described embodiments. The gate driving circuit 10 can be directly fabricated on a substrate of a display apparatus by adopting the processes similar to those for forming a thin film transistor, and can realize a function of performing display line by line.

For example, as shown in FIG. 9, except the first-stage shift register units, the input signal terminals INPUTs of the shift register units of the other stages are coupled to the output terminals OUTs of the shift register units of the preceding stage. Except the last-stage shift register unit, the reset signal terminals RESETs of the shift register units of the other stages are coupled to the output terminals OUTs of the shift register units of the next stage. For example, the input signal terminal INPUT of the first-stage shift register unit can be configured to receive a trigger signal STV, and the reset signal terminal RESET of the last-stage shift register unit can be configured to receive the reset signal RST. The above-described case is a case of the forward scanning, when the reverse scanning is performed, the above-described trigger signal STV for the first-stage shift register unit is replaced with the reset signal RST, and the above-described reset signal RST for the last-stage shift register unit is replaced with the trigger signal STY.

For example, the gate driving circuit 10 further includes a first clock signal line CLK1 and a second clock signal line CLK2. For example, the first clock signal line CLK1 is configured to be coupled to the first clock signal terminals CKs of the odd-stage shift register units 100, and coupled to the second clock signal terminal CKBs of the even-stage shift register units 100; the second clock signal line CLK2 is configured to be coupled to the second clock signal terminals CKBs of the odd-stage shift register units 100, and coupled to the first clock signal terminals CKs of the even-stage shift register units 100.

It should be noted that in different examples, according to different configurations, more clock signal lines can be adopted to provide more clock signals, such as four clock signal lines, six clock signal lines, or the like.

For example, as shown in FIG. 9, the gate driving circuit 10 further includes a timing controller 200. For example, the timing controller 200 is configured to provide clock signals to shift register units 100, and the timing controller 200 also be configured to provide the trigger signal STV and the reset signal RST.

The technical effects of the gate driving circuit 10 provided in the embodiments of the present disclosure can refer to the corresponding descriptions of the shift register units 100 in the embodiments of the present disclosure, and details are not described here again.

Figure 10:
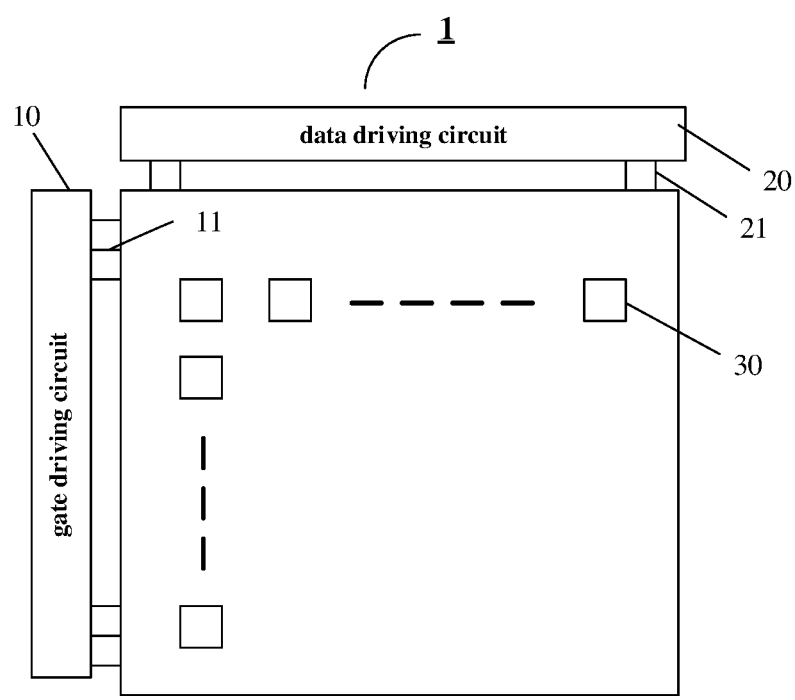
FIG. 10 is a schematic block diagram of a display apparatus according to an embodiment of the present disclosure

At least one embodiment of the present disclosure further provides a display apparatus 1, as shown in FIG. 10, the display apparatus 1 includes the gate driving circuit 10 provided by any of the embodiments of the present disclosure. The display apparatus 1 includes an array of a plurality of pixel units 30. For example, the display apparatus 1 further includes a data driving circuit 20. The data driving circuit 20 is configured to provide data signals to a pixel array; the gate driving circuit 10 is configured to provide gate scanning signals to the pixel array. The data driving circuit 20 is electrically coupled to the pixel units 30 through data lines 21, and the gate driving circuit 10 is electrically coupled to the pixel units 30 through gate lines 11.

It should be noted that the display apparatus 1 in this embodiment can be a liquid crystal panel, a liquid crystal television, a display, an OLED panel, an OLED television, an electronic paper, a mobile phone, a tablet computer, a notebook computer, a digital photo frame, a navigator and other products or members having display function. The display apparatus 1 further includes other conventional members, such as a display panel, which are not limited by the embodiments of the present disclosure.

The technical effects of the display apparatus 1 provided in the embodiments of the present disclosure can refer to the corresponding descriptions of the shift register units 100 in the embodiments of the present disclosure, and details are not described herein again.

At least one embodiment of the present disclosure further provides a driving method, and the driving method can be adopted to drive any one of the shift register units 100 provided in the embodiments of the present disclosure. The driving method including: in the first state, the first pull-down circuit 120 pulling down the level of the pull-up node PU, and the second pull-down circuit 130 pulling down the level of the output terminal OUT.

For example, in the case that the shift register unit 100 including the third pull-down driving circuit 150 and the third pull-down circuit 160, the above-described driving method further includes the following operations.

In a second display state, in a first stage, the input signal terminal INPUT is at a high level, the reset signal terminal RESET is at a low level, the second level signal terminal CNB is at a low level, the first level signal terminal CN is at a high level, the first clock signal terminal CK is at a low level, and the second clock signal terminal CKB is at a high level; the input circuit 110 charges the pull-up node PU, the output terminal OUT outputs the low level of the first clock signal terminal CK, that is, outputting the signal inputted by the first clock signal terminal CK, and the third pull-down driving circuit 150 pulls down the level of the pull-down node PD.

In a second stage, the input signal terminal INPUT is at a low level, the reset signal terminal RESET is at a low level, the second level signal terminal CNB is at a low level, the first level signal terminal CN is at a high level, the first clock signal terminal CK is at a high level, and the second clock signal terminal CKB is at a low level; the output terminal OUT outputs the high level of the first clock signal terminal CK, that is, outputting a signal inputted by the first clock signal terminal CK, and the third pull-down driving circuit 150 pulls down the level of the pull-down node PD.

In a third stage, the input signal terminal INPUT is at a low level, the reset signal terminal RESET is at a high level, the second level signal terminal CNB is at a low level, the first level signal terminal CN is at a high level, the first clock signal terminal CK is at a low level, and the second clock signal terminal CKB is at a high level; the input circuit 110 pulls down the level of the pull-up node PU, the third pull-down driving circuit 150 pulls up the level of the pull-down node PD, and the third pull-down circuit 160 pulls down the level of the output terminal OUT to the level approximately the same as the low level power signal terminal VGL.

The first pull-down circuit 120 and the second pull-down circuit 130 are in a turn-off state in the second state.

It should be noted that, for a detailed description and technical effects of the above-described driving method, reference can be made to the description of the operation principle of the shift register unit 100 in the related embodiment of the present disclosure, and details are not described herein again.

What have been described above are only specific implementations of the present disclosure, the protection scope of the present disclosure is not limited thereto. The protection scope of the present disclosure should be based on the protection scope of the claims.

What is claimed is:

1. A shift register unit, comprising an input circuit, a first pull-down circuit, a second pull-down circuit, and an output circuit;

wherein the input circuit is coupled to a pull-up node, an input signal terminal, a first level signal terminal, a reset signal terminal and a second level signal terminal, and is configured to charge the pull-up node;

the output circuit is coupled to the pull-up node, a first clock signal terminal and an output terminal, and is configured to output a signal inputted by the first clock signal terminal to the output terminal under control of a level of the pull-up node;

the first pull-down circuit is coupled to the pull-up node, a first level power signal terminal and a third level signal terminal; and the second pull-down circuit is coupled to the first clock signal terminal, a second clock signal terminal, the first level power signal terminal and the output terminal;

wherein in a first state, the first pull-down circuit is configured to pull down the level of the pull-up node, and the second pull-down circuit is configured to pull down a level of the output terminal;

the second pull-down circuit comprises a second transistor and a third transistor;

a gate electrode of the second transistor is coupled to the first clock signal terminal, a first electrode of the second transistor is coupled to a second electrode of the third transistor, and a second electrode of the second transistor is coupled to the output terminal; and a gate electrode of the third transistor is coupled to the second clock signal terminal, and a first electrode of the third transistor is coupled to the first level power signal terminal.

2. The shift register unit according to claim 1, wherein the first pull-down circuit comprises a first transistor;
a gate electrode of the first transistor is coupled to the third level signal terminal, a first electrode of the first transistor is coupled to the pull-up node, and a second electrode of the first transistor is coupled to the first level power signal terminal.

3. The shift register unit according to claim 1, wherein both the second transistor and the third transistor are p-type transistors.

4. The shift register unit according to claim 1, wherein the input circuit comprises a fourth transistor and a fifth transistor;
a gate electrode of the fourth transistor is coupled to the input signal terminal, a first electrode of the fourth transistor is coupled to the first level signal terminal, and a second electrode of the fourth transistor is coupled to the pull-up node; and
a gate electrode of the fifth transistor is coupled to the reset signal terminal, a first electrode of the fifth transistor is coupled to the pull-up node, and a second electrode of the fifth transistor is coupled to the second level signal terminal.

5. The shift register unit according to claim 1, wherein the output circuit comprises a sixth transistor and a first capacitor;
a gate electrode of the sixth transistor is coupled to the pull-up node, a first electrode of the sixth transistor is coupled to the first clock signal terminal, and a second electrode of the sixth transistor is coupled to the output terminal; and
a first end of the first capacitor is coupled to the pull-up node, and a second end of the first capacitor is coupled to the output terminal.

6. The shift register unit according to claim 1, further comprising a third pull-down driving circuit and a third pull-down circuit;
the third pull-down driving circuit is coupled to a pull-down node, the pull-up node, the first level power signal terminal and the second clock signal terminal, and is configured to control a level of the pull-down node in a second state; and
the third pull-down circuit is coupled to the pull-down node, the pull-up node, the first level power signal terminal and the output terminal, and is configured to pull-down the level of the pull-up node and the level of the output terminal under control of the level of the pull-down node in the second state.

7. The shift register unit according to claim 6, wherein the third pull-down circuit comprises a seventh transistor and an eighth transistor;
a gate electrode of the seventh transistor is coupled to the pull-down node, a first electrode of the seventh transistor is coupled to the output terminal, and a second electrode of the seventh transistor is coupled to the first level power signal terminal; and
a gate electrode of the eighth transistor is coupled to the pull-down node, a first electrode of the eighth transistor is coupled to the pull-up node, and a second electrode of the eighth transistor is coupled to the first level power signal terminal.

8. The shift register unit according to claim 6, wherein the third pull-down driving circuit comprises a ninth transistor and a tenth transistor;
a gate electrode and a first electrode of the ninth transistor are coupled to the second clock signal terminal, and a second electrode of the ninth transistor is coupled to the pull-down node; and
a gate electrode of the tenth transistor is coupled to the pull-up node, a first electrode of the tenth transistor is coupled to the pull-down node, and a second electrode of the tenth transistor is coupled to the first level power signal terminal.

9. The shift register unit according to claim 8, wherein the third pull-down driving circuit further comprises an eleventh transistor;
a gate electrode of the eleventh transistor is coupled to the output terminal, a first electrode of the eleventh transistor is coupled to the pull-down node, and a second electrode of the eleventh transistor is coupled to the first level power signal terminal.

10. A gate driving circuit, comprising a plurality of cascaded shift register units each of which is according to claim 1.

11. A gate driving circuit, comprising a plurality of cascaded shift register units each of which is according to claim 6.

12. A display apparatus, comprising the gate driving circuit according to claim 10.

13. A display apparatus, comprising the gate driving circuit according to claim 11.

14. A driving method of the shift register unit according to claim 1, comprising: in the first state, the first pull-down circuit pulling down the level of the pull-up node, and the second pull-down circuit pulling down the level of the output terminal.

15. The driving method according to claim 14, further comprising:
in a second state, in a first stage, the input circuit charging the pull-up node, and the output terminal outputting a signal inputted by the first clock signal terminal;
in a second stage, the output terminal outputting a signal inputted by the first clock signal terminal; and
in a third stage, the input circuit pulling down the level of the pull-up node, wherein the first pull-down circuit and the second pull-down circuit are in a turn-off state in the second state.

16. A driving method of the shift register unit according to claim 6, comprising: in the first state, the first pull-down circuit pulling down the level of the pull-up node, and the second pull-down circuit pulling down the level of the output terminal.

17. The driving method according to claim 16, further comprising:
in a second state, in a first stage, the input circuit charging the pull-up node, the output terminal outputting a signal inputted by the first clock signal terminal, and the third pull-down driving circuit pulling down the level of the pull-down node;
in a second stage, the output terminal outputting a signal inputted by the first clock signal terminal, and the third pull-down driving circuit pulling down the level of the pull-down node; and
in a third stage, the input circuit pulling down the level of the pull-up node, the third pull-down driving circuit pulling up the level of the pull-down node, and the third pull-down circuit pulling down the level of the output terminal to be approximately the same as the first level power signal terminal, wherein the first pull-down circuit and the second pull-down circuit are in a turn-off state in the second state.

* * * * *